United States Patent [19]

Krulik et al.

[11] Patent Number: 5,219,815

[45] Date of Patent: * Jun. 15, 1993

[54] LOW CORROSIVITY CATALYST CONTAINING AMMONIUM IONS FOR ACTIVATION OF COPPER FOR ELECTROLESS NICKEL PLATING

[75] Inventors: Gerald A. Krulik, El Toro, Calif.; Nenad V. Mandich, Homewood, Ill.

[73] Assignee: Applied Electroless Concepts Inc., El Toro, Calif.

[*] Notice: The portion of the term of this patent subsequent to May 18, 2010 has been disclaimed.

[21] Appl. No.: 763,634

[22] Filed: Sep. 23, 1991

[51] Int. Cl.$^5$ .................. B01J 23/44; B01J 23/46; B01J 27/08; B01J 27/10

[52] U.S. Cl. .................. 502/200; 427/304; 427/305

[58] Field of Search .......... 502/339, 200; 427/304, 427/305

[56] References Cited

U.S. PATENT DOCUMENTS

| | | | |
|---|---|---|---|
| 4,066,804 | 1/1978 | Andrews | 427/305 X |
| 4,719,145 | 1/1988 | Neely | 427/305 X |
| 4,804,410 | 2/1989 | Haga et al. | 427/304 X |

FOREIGN PATENT DOCUMENTS

| | | | |
|---|---|---|---|
| 2120327 | 11/1971 | Fed. Rep. of Germany | 427/304 |
| 60-033355 | 2/1985 | Japan | 427/304 |

OTHER PUBLICATIONS

G. G. Gawrilov, Chemical (Electroless) Nickel Plating, Port Callis Press, 1979, p. 114 & title and 1st table of contents page (3 total).

Primary Examiner—W. J. Shine
Assistant Examiner—Douglas J. McGinty

[57] ABSTRACT

This invention relates to electroless nickel plating of metals which are normally noncatalytic for electroless nickel initiation. It is especially useful in the electronics industry, such as for production of electroless nickel-/electroless gold tabs or surface mount pads on printed circuit boards, and for use in electroless nickel plating over copper for radiofrequency interference shielding. More particularly, it comprises ammonium halide salt solutions of a palladium salt with another Group VIII precious metal salt and acid and optionally an alkali halide salt for effectively and completely catalyzing the initiation of electroless nickel plating on copper substrates.

13 Claims, No Drawings

LOW CORROSIVITY CATALYST CONTAINING AMMONIUM IONS FOR ACTIVATION OF COPPER FOR ELECTROLESS NICKEL PLATING

BACKGROUND OF THE INVENTION

1. Field of the Invention

This invention relates to electroless nickel plating of materials which do not spontaneously initiate electroless nickel plating without a catalyst. It is especially useful in the electronics industry, such as for production of electroless nickel/electroless gold tabs or surface mount pads on printed circuit boards, and for use in electroless nickel plating over copper for radiofrequency interference shielding. More particularly, it comprises new and improved compositions containing ammonium salts with precious metals for effectively and completely catalyzing the initiation of electroless nickel plating on copper substrates.

2. Background and Prior Art

Numerous methods have been used to selectively catalyze copper metal for initiation of electroless nickel plating. Copper is considered a poor or even a noncatalyst for electroless nickel compositions using sodium hypophosphite as the nickel reducing agent. Some method must be used to begin the initial plating of electroless nickel. Once a small amount of electroless nickel has plated, electroless nickel plating will continue without need for further catalyzation of the surface.

Numerous methods are known to initiate electroless plating onto metals which will not spontaneously begin plating. G. G. Gawrilov (in Chemical (Electroless) Nickel Plating, Portcullis Press) gives the following methods: contact with aluminum or iron wire while immersed in the electroless nickel; applying a pulse of electric current when first immersed in the electroless nickel; soaking in a solution of sodium borohydride, dimethylaminoborane, or other organoboron reducing agent immediately before immersion in the electroless nickel; electroplating with a thin layer of electrolytic nickel; using an electroless nickel 'strike' bath of high hypophosphite concentration; and immersion in an acid solution of palladium chloride.

The most common catalytic initiation method is the use of a solution of palladium chloride (0.01–0.3 g/l) in hydrochloric acid.

All of these methods suffer from one or more disadvantages. Contact with aluminum or iron wires is useful only for small parts. Printed circuit boards having discrete separate copper pads and circuits cannot be done, as each separated portion of copper will need to be touched. The electric current method and the electrolytic nickel plating methods likewise cannot be used on discontinuous copper sections. If either the electric current or electrolytic nickel plating method is used on large and complex parts with crevices and recessed areas, poor and nonuniform catalysis occurs. Surface treatment with solutions of boron reducing agents can be effective, but these solutions are high in actual usage cost since they rapidly decompose when trace amounts of metal ions are introduced. The boron reducing agents can also desorb from the part and destabilize electroless nickel plating solutions. Use of a very active hypophosphite electroless nickel 'strike' is not reliable, and the strike bath quickly decomposes.

The best and most widely used commercial catalysis method is the use of an acidic solution of palladium chloride. A typical commercial formulation is Activator 440 (Enthone Inc.). This consists of 4.4 g palladium chloride per liter in 8% hydrochloric acid. Recommended use condition is dilution to 6%, or 275 mg palladium chloride per liter. Hydrochloric acid is added as necessary to control hydrolytic decomposition of the palladium chloride. While effective under normal circumstances, it suffers from several disadvantages, especially when to catalyze printed circuit boards. Palladium chloride rapidly attacks and forms an immersion deposit on most metals. This deposit does not give a continuous metallic deposit. It forms small catalytic sites which continue to grow as long as the copper is immersed in the catalyst solution. Excess catalysis leads to overactivation problems in the electroless nickel, as excess palladium may not adhere completely. This will contaminate and decompose the electroless nickel, and also cause poor adhesion of the electroless nickel. The operating window is very narrow, requiring precise control of immersion time and palladium concentration. Good rinsing is critical for good results. Consumption and overuse of palladium is very great. Printed circuit boards, especially those having numerous small discrete copper areas, are difficult to uniformly plate with the reliability needed for a commercial process. This problem is especially severe when dealing with boards intended for surface mount applications. These boards have tiny wells produced by a 1–5 mil thick layer of organic solder mask completely surrounding the surface mount tabs. These wells are very difficult to completely rinse and catalyze.

The commercial catalytic olefin oxidation process known as the Wacker process uses acidic palladium chloride solutions. Only ionic palladium is catalytic for this process, and it is reduced to palladium metal during olefin oxidation. A second catalytic cycle is coupled with this process to continuously regenerate ionic palladium. The second catalyst system consisting of air and cupric chloride rapidly redissolves metallic palladium. While not wishing to be bound by theory, it is known that copper ions rapidly build up in any acidic palladium bath used for copper catalysis. Older used baths are less effective than fresh baths, even when the palladium concentration is controlled. It is likely that a complex precipitation-redissolution cycle involving ionic and metallic palladium, ionic and metallic copper, air and acid, all contribute to the difficulties in achieving uniform process control and reproducibility.

A related patent disclosure, U.S. patent application Ser. No. 07/756,626 filed Sep. 9, 1991, abandoned, has shown that improved results for catalyzation of copper can be effected by use of mixtures of palladium and a Group VIII precious metal salt in acidic solution. This process does suffer from several disadvantages. The highly acidic catalyst is corrosive to the substrate, so immersion times must be controlled and of short duration to prevent overdeposition of catalyst on the surface. The copper which is dissolved in the catalyst solution can attack and redissolve the deposited palladium metal, leading to poor adhesion. The acidity of the catalyst bath must be high to prevent catalyst decomposition due to spontaneous hydrolysis of the precious metal salts. Rinsing is difficult due to the rapid hydrolysis of the catalyst as the pH is increased.

A further related patent disclosure, U.S. patent application Ser. No. 07/763,646 filed Sep. 23, 1991, allowed, has shown that even better results for catalyzation of copper can be effected by the addition of high concentrations of alkali halide salts to the mixture of palladium and a Group VIII precious metal salt. Lower acidity halide salt solutions of palladium chloride solutions containing ruthenium chloride show more uniform activation, easier activation, longer catalyst bath life, and fewer problems with overactivation and nickel adhesion. The process window for these low acidity mixed catalysts is much wider for these novel compositions than for the traditional highly acidic metal catalyst systems. However, there are some disadvantages to the use of alkali halide salts in place of acid. The high concentration of alkali halide salt can lead to precipitation and crystallization of the salt in the tank, especially when the temperature decreases. This leads to variations in the stability of the catalyst. The amount of the decrease in acid which is useful is limited, since the precious metal halide complexes are not completely stable to hydrolysis. Even quite high halide ion concentrations give incomplete assurance against hydrolysis and decomposition of the precious metal salts due to the relatively low stability of the precious metal halide complexes.

SUMMARY OF THE INVENTION

The present invention is based on the discovery that an ammonium halide salt solution of a mixed precious metal catalyst solution gives significantly better results for electroless nickel initiation on copper than does a pure acidic solution or an alkali halide solution. Ammonium halide salt solutions of palladium chloride solutions containing ruthenium chloride show more uniform activation, easier activation, longer catalyst bath life, and fewer problems with overactivation and nickel adhesion. The greater stability of the ammonium halide salt mixed catalyst system allows formulation of practical catalyst systems at a wide range of acid concentrations and halide concentrations. The higher stability of ammonium halide salts with their greater ability to retard hydrolysis and decomposition offer significant advantages over alkali halide salt compositions. It is highly resistant to formation of loosely adherent catalyst colloids which otherwise are produced by hydrolytic decomposition of the precious metal salts during rinsing. The process window for use of these ammonium halide salt mixed catalysts is much wider for these novel compositions than for the traditional highly acidic metal catalyst systems. The acid may be organic or inorganic.

These novel compositions work well at room temperature but they are also effective at an elevated temperature. It is theorized that these ammonium halide salt mixed precious metal catalysts may work more effectively because the presence of ammonium ions helps increase the dissolution rate of the copper substrate even at high pH where copper normally is attacked very slowly. The high concentration of ammonium halide salt will help maintain the precious metals in solution without hydrolysis to ineffective hydroxides or oxides or metal colloids. Rinsing is more effective as the formation of adherent colloidal materials in the first rinse is greatly retarded. The concentration of ammonium halide salt is between about 1 and 600 g/l preferably between about 5 and 300 g/l.

Palladium is the most soluble of the six precious transition metals (palladium, ruthenium, rhodium, platinum, iridium, osmium). Palladium will dissolve easily in plain nitric acid. Rhodium, platinum, and iridium are not dissolved in nitric acid, but will dissolve in aqua regia. Osmium and ruthenium will not dissolve in any acid up to the boiling point. The mixed deposits of any of the other five metals with palladium are expected to be more chemically resistant than pure palladium metal. All of the six precious transition metals are singly known to be effective as electroless nickel initiation catalysts. All of these Group VIII precious metals form soluble ammonium halide complexes which are stable even at relatively high pH.

Rinsing is more effective as the formation of colloidal materials in the first rinse is greatly retarded, lessening the change of random non-adherent catalyst deposition on non-conductive surfaces. Non-conductive surfaces are almost always present when electroless nickel is deposited for printed circuit board use. The copper is normally present in noncontinuous form as isolated circuits, plated drilled through-holes, and mounting pads. The rest of the surface is either the base material, such as epoxy-glass printed circuit board laminate, or a protective coating such as permanent solder masks.

The ammonium halide salt mixed catalyst system also results in more stable electroless nickel baths since the catalyst is much less prone to hydrolysis or colloid formation during rinsing. These hydrolysis products and metal colloids can cause significant destabilization if dragged into the electroless nickel bath. It is well known that such materials are adherent and hard to completely remove once formed. The ammonium halide salt systems give much improved rinsing due to the slower rate of hydrolysis when these materials are rinsed. Cross-sections of the electroless nickel deposit on ammonium halide mixed catalyst systems show a much thinner black line of catalyst than is seen with highly acidic mixed catalyst systems, yet the total performance is superior.

These novel catalytic compositions are not limited in usefulness to copper catalyzation. They may also be used on other normally noncatalytic or difficult to catalyze surfaces such as silver, silver inks, mixed metal particle inks, conductive paints, etc. Likewise, these novel compositions may be useful with any electroless metal plating bath, such as electroless silver, electroless copper, and electroless gold.

DESCRIPTION OF THE PREFERRED EMBODIMENTS

Although the disclosure hereof is detailed and exact, the formulations listed in the examples are merely illustrative of the useful catalyst formulations. Any formulator skilled in the art can utilize these examples and this concept to prepare many workable solutions in addition to those shown in the examples.

The test materials used for catalysts consisted of solutions of palladium(II) chloride and ruthenium(III) chloride in ammonium chloride and hydrochloric acid. An alkali metal halide was optionally used. Test articles were copper clad epoxy glass printed circuit board material. These boards were selectively etched to give a variety of discrete copper pad and circuit areas, using the standard Institute of Printed Circuits solder mask test grid, A-25. The boards were then coated with Probimer(TM) (Ceiba-Geigy Corp) on the bare epoxy areas. This gives printed circuit and surface mount simulation test pads. The cleaner was Duraclean LPH-3 (Duratech Industries Inc). The microetchant was Ardrox PC-7076 (Ardrox Inc.). The electroless nickel solution used was Niposit 65 (Shipley Company). The immersion gold solution was Lectroless Prep (Enthone- OMI-Selrex). The autocatalytic electroless gold was Microgold 294 (Stapleton Technologies Corp.).

EXAMPLES 1-6

Test panels were copper-clad double sided printed circuit boards selectively etched and coated with Probimer(TM) solder mask to give discrete exposed copper pads and circuits. Test panels were all given a standard process cycle before and after catalysis. This cycle is given in Table I. Rinses are understood between each process step.

TABLE I

| | |
|---|---|
| Clean | Duraclean LPH-3; 1 min |
| Microetch | Ardrox PC-7076; 1 min |
| Acid Dip | Sulfuric acid, 10%; 0.5 min |
| Acid Dip | Hydrochloric acid, 10%; 0.5 min |
| Catalyst | Per examples |
| Electroless nickel | Niposit 65; 20 min |
| Immersion gold | Lectroless Prep; 1 min |
| Electroless gold | Microgold; 10 min |

Catalyst quality was measured in several ways. The electroless nickel thickness was measured. The electroless gold bath will attack exposed copper, causing adhesion and appearance failures, so this is a sensitive indicator of the nickel porosity and incomplete coverage.

The first example shows the results for a standard mixed palladium chloride/ruthenium chloride/hydrochloric acid catalyst.

EXAMPLE 1

The catalyst solution consisted of 100 mg/l palladium chloride and 150 mg/l ruthenium chloride in 5% hydrochloric acid. Immersion time was 3 min at 100 F. Electroless nickel thickness was 219 millionths of an inch. Electroless nickel adhesion was good. Electroless gold appearance was good and adhesion was excellent.

The following examples show the greater activity of the new catalyst and illustrate some of the available range of concentrations which are usable.

EXAMPLE 2

The catalyst solution consisted of 100 mg/l palladium chloride and 150 mg/l ruthenium chloride in a solution of 20 g/l ammonium chloride and 15% hydrochloric acid. Temperature was 80 F. and immersion time was 1 minute. The electroless nickel thickness was 256 millionths of an inch. Adhesion and appearance of the total coating with electroless gold was excellent.

EXAMPLE 3

The catalyst solution consisted of 75 mg/l palladium chloride and 100 mg/l ruthenium chloride in 15 g/l ammonium chloride and 2% hydrochloric acid. Temperature was 100 F. and immersion time was 3 minutes. The electroless nickel thickness was 277 millionths of an inch. Adhesion and appearance of the total coating with electroless gold was excellent.

EXAMPLE 4

The catalyst solution consisted of 25 mg/l palladium chloride and 50 mg/l ruthenium chloride in 15 g/l ammonium chloride and 2% hydrochloric acid. Temperature was 80 F. and immersion time was 1 minute. The electroless nickel thickness was 369 millionths of an inch. Adhesion and appearance of the total coating with electroless gold was excellent.

EXAMPLE 5

The catalyst solution consisted of 75 mg/l palladium chloride and 100 mg/l ruthenium chloride in 35 g/l ammonium chloride and 75 g/l sodium chloride with 5% hydrochloric acid. Temperature was 80 F. and immersion time was 1 minute. The electroless nickel thickness was 274 millionths of an inch. Adhesion and appearance of the total coating with electroless gold was excellent.

EXAMPLE 6

The catalyst solution consisted of 75 mg/l palladium chloride and 50 mg/l ruthenium chloride in 15 g/l ammonium chloride and 25 g/l sodium chloride with 5% hydrochloric acid. Temperature was 100 F. and immersion time was 1 minute. The electroless nickel thickness was 290 millionths of an inch. Adhesion and appearance of the total coating with electroless gold was excellent.

EXAMPLE 7

The catalyst solution consisted of 50 mg/l palladium chloride and 100 mg/l ruthenium chloride in 240 g/l ammonium chloride and 1% hydrochloric acid. Temperature was 75 F. and immersion time was 1 minute. The electroless nickel thickness was 344 millionths of an inch. Adhesion and appearance of the total coating with electroless gold was excellent.

EXAMPLE 8

The catalyst solution consisted of 50 mg/l palladium chloride and 50 mg/l ruthenium chloride in 240 g/l ammonium chloride 0.1% hydrochloric acid. Temperature was 75 F. and immersion time was 1 minute. The electroless nickel thickness was 300 millionths of an inch. Adhesion and appearance of the total coating with electroless gold was excellent.

What is claimed is:

1. A catalyst composition for initiation of an electroless metal plating composition on otherwise nonplatable metallic materials, comprising an aqueous solution containing a mixture of a palladium salt and at least one other Group VIII precious metal salt, an ammonium halide salt and an organic acid.

2. The catalyst composition of claim 1 wherein said composition additionally contains an alkali halide salt.

3. The catalyst composition of claim 1 wherein the concentration of said ammonium halide salt is between about 1 and 600 g/l.

4. The catalyst composition of claim 1 wherein the concentration of said ammonium halide salt is between about 5 and 300 g/l.

5. The catalyst composition of claim 1 wherein same ammonium halide salt is ammonium chloride.

6. The catalyst composition of claim 1 wherein the other said Group VIII precious metal is ruthenium.

7. The catalyst composition of claim 2 wherein said alkali halide salt is sodium chloride.

8. The catalyst composition of claim 1 wherein said otherwise nonplatable metallic materials comprises copper.

9. The catalyst composition of claim 1 wherein said otherwise nonplatable metallic materials comprises silver.

10. The composition of claim 1 wherein said electroless metal plating composition comprises electroless nickel.

11. The composition of claim 1 wherein said electroless metal plating composition comprises electroless copper.

12. The composition of claim 1 wherein said electroless metal plating composition comprises electroless gold.

13. The composition of claim 1 wherein said electroless metal plating composition comprises electroless silver.

* * * * *